United States Patent
Heiling

(10) Patent No.: US 9,541,932 B2
(45) Date of Patent: Jan. 10, 2017

(54) MONITORING CURRENT IN POWER SWITCH DEVICES

(71) Applicant: Infineon Technologies AG, Neubiberg (DE)

(72) Inventor: Christian Heiling, Graz (AT)

(73) Assignee: Infineon Technologies AG, Neubiberg (DE)

( * ) Notice: Subject to any disclaimer, the term of this patent is extended or adjusted under 35 U.S.C. 154(b) by 169 days.

(21) Appl. No.: 14/481,070

(22) Filed: Sep. 9, 2014

(65) Prior Publication Data

US 2016/0070279 A1    Mar. 10, 2016

(51) Int. Cl.
*G05F 1/56*    (2006.01)
*G01R 19/257*    (2006.01)

(52) U.S. Cl.
CPC ............... *G05F 1/56* (2013.01); *G01R 19/257* (2013.01)

(58) Field of Classification Search
CPC .......... G01R 19/257; G01R 7/00; G01R 19/00
USPC ..... 341/120, 118, 155, 135, 142; 330/85, 88
See application file for complete search history.

(56) References Cited

U.S. PATENT DOCUMENTS

| | | |
|---|---|---|
| 6,414,404 B1 | 7/2002 | Allen |
| 2004/0155662 A1 | 8/2004 | Graf et al. |
| 2009/0039869 A1* | 2/2009 | Williams ........... G01R 19/0092 324/123 R |
| 2009/0179687 A1 | 7/2009 | Barker |
| 2010/0007328 A1 | 1/2010 | Sander et al. |
| 2012/0139887 A1* | 6/2012 | Hsu ........................... G01J 1/46 345/211 |
| 2012/0319878 A1 | 12/2012 | Bogner et al. |
| 2013/0057241 A1 | 3/2013 | Shuvalov |
| 2015/0229213 A1* | 8/2015 | Syngaevskiy ......... H02M 3/155 323/271 |

FOREIGN PATENT DOCUMENTS

| | | |
|---|---|---|
| DE | 10258766 A1 | 7/2004 |
| DE | 102008032556 B3 | 9/2009 |
| DE | 102012209717 A1 | 12/2012 |

OTHER PUBLICATIONS

Wikipedia, "Analog-to-digital converter", retrieved from the internet <https://en.wikipedia.org/w/index.php?title=Analog%ADto%ADdigital_converter&oldid=620909959>, version accessed on Aug. 12, 2014, 12 pp.

Office Action, in the German language, from counterpart German Application No. 102015114034.9, dated Oct. 17, 2016, 20 pp.

* cited by examiner

*Primary Examiner* — Peguy Jean Pierre
(74) *Attorney, Agent, or Firm* — Shumaker & Sieffert, P.A.

(57) ABSTRACT

In one example, a method includes generating, by a main switching element of a device, a load current; generating, by a regulation loop of the device, a sense current proportional to the load current; directly converting, by an analog-to-digital converter (ADC) of the device, the sense current into a digital sense current value; and outputting, by the device and to an external device, a digital representation of the load current based on the digital sense current value.

15 Claims, 5 Drawing Sheets

MONITORING CURRENT IN POWER SWITCH DEVICES

TECHNICAL FIELD

This disclosure relates to converting an electrical current into a digital representation.

BACKGROUND

Drivers may be used to control the amount of current provided to loads. Drivers may either be high-side drivers or low-side drivers. A driver may be characterized as a high-side driver if it is positioned between a positive power source and a load, and may be characterized as a low-side driver if it is positioned between a negative power source and the load. In some examples, a load may be driven by a high-side driver, a low-side driver, or both a high-side driver and a low-side driver. In any case, it may be desirable to measure the amount of current provided by a particular driver. For example, a controller of a driver may implement a feedback loop to adjust the amount of current provided by a driver based on the measured amount of current.

SUMMARY

In general, this disclosure is directed to devices and methods which utilize techniques for directly converting an analog current proportional to the amount of current that is delivered from a driver to a load into a digital value without first converting the analog current into an analog voltage value.

In one example, a method includes generating, by a main switching element of a device, a load current; generating, by a regulation loop of the device, a sense current proportional to the load current; directly converting, by an analog-to-digital converter (ADC) of the device, the sense current into a digital sense current value; and outputting, by the device and to an external device, a digital representation of the load current based on the digital sense current value.

In another example, a power switching device includes a main switching element configured to generate a load current; a regulation loop configured to generate a sense current proportional to the load current; an analog-to-digital converter (ADC) configured to directly convert the sense current into a digital sense current value; and a controller configured to output a digital representation of the load current based on the digital sense current value to an external device.

In another example, a power switching device includes means for generating a load current; means for generating a sense current proportional to the load current; means for directly converting the sense current into a digital sense current value; and means for outputting, to an external device, a digital representation of the load current based on the digital sense current value.

The details of one or more examples of the disclosure are set forth in the accompanying drawings and the description below. Other features, objects, and advantages will be apparent from the description and drawings, and from the claims.

DETAILED DESCRIPTION

In general, this disclosure is directed to devices and methods which utilize techniques for directly converting an analog current proportional to the amount of current that is delivered from a driver to a load into a digital value without first converting the analog current into an analog voltage value. For instance, a device may include a main driver which may be used to provide current to a load, a regulation loop which may be used to generate a sense current proportional to the load current, and an analog-to-digital converter (ADC) which may directly convert the sense current into a digital representation of the amount of current provided to the load. In some examples, the device may determine a digital value based on the digital sense current value, and output the digital value to another device. In this way, as opposed to outputting an analog representation of the amount of current provided to the load, the device may output a digital representation of the amount of current provided to the load.

Figure 1:
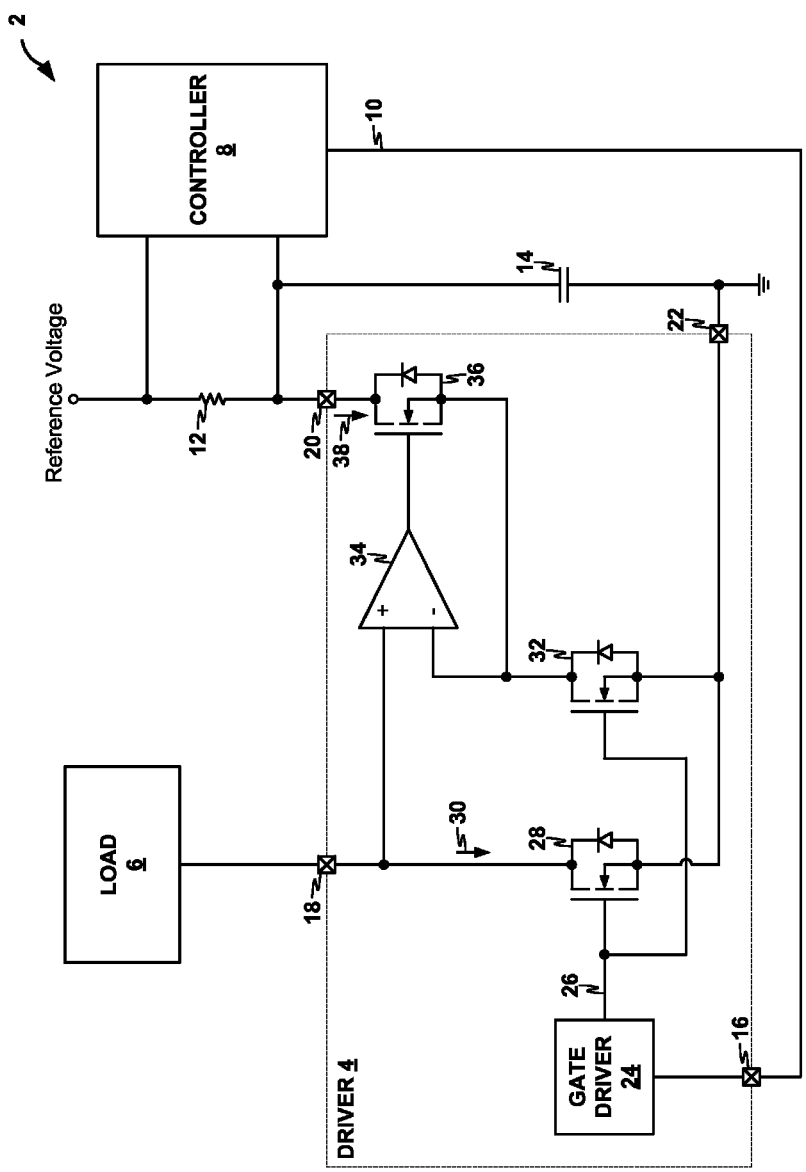
FIG. 1 is a conceptual diagram of a system that includes an example device for monitoring an amount of current provided to a load, in accordance with one or more exemplary embodiments of this disclosure.

FIG. 1 is a conceptual diagram illustrating a system that includes an example device for monitoring an amount of current provided to a load, in accordance with one or more exemplary techniques of this disclosure. As illustrated in FIG. 1, system 2 includes driver 4, load 6, controller 8, sense resistor 12, and capacitor 14.

In some examples, system 2 may include load 6 which may be configured to receive power from driver 4. In some examples, load 6 may include one or more light emitting devices (e.g., one or more light bulbs, one or more light emitting diodes (LEDs), one or more laser diodes, and the like), one or more batteries, one or more computing devices, one or more resistive devices, one or more capacitive devices, one or more inductive devices, any other device that uses electrical power, or any combination of the same. As illustrated in FIG. 1, load 6 may be connected to output connector 18 of driver 4 such that driver 4 may be a low-side driver with respect to load 6.

As illustrated in FIG. 1, system 2 includes driver 4, which may be configured to control the amount of current flowing through load 6. In some examples, driver 4 includes input connector 16, output connector 18, current feedback connector 20, ground connector 22, gate driver 24, main driver 28, sense driver 32, amplifier 34, and regulation driver 36. Examples of driver 4 include, but are not limited to, integrated circuits, and discrete components.

In some examples, driver 4 may include input connector 16, output connector 18, current feedback connector 20, and ground connector 22. In some examples, one or more of input connector 16, output connector 18, current feedback connector 20, and ground connector 22 may be high voltage interface connectors, which, in some examples, may be larger than connectors that are not high voltage interface connectors. For instance, current feedback connector 20 may comprise a high voltage interface connector in order to comply with one or more safety requirements, such as ISO26262 and/or IEC61508.

In some examples, driver 4 may include gate driver 24, which may be configured to output a signal to control one or more drivers. For instance, gate driver 24 may output control signal 26 to the gates of main driver 28 and sense driver 32. In some examples, gate driver 24 may output control signal 26 based on a signal received from one or more other components of system 2, such as control signal 10 received from controller 8.

In some examples, driver 4 may include main driver 28, which may be configured to provide power to drive a load based on a control signal. For instance, main driver 28 may generate load current 30 to driver load 6 via output connector 18 based on control signal 26. In some examples, main driver 28 may include one or more power transistors, one or more metal-oxide-semiconductor field-effect transistors (MOSFETs), one or more thyristors, one or more insulated-gate bipolar transistors (IGBTs), and/or a combination of the same. Some example MOSFETs that may be included in main driver 28 include, but are not limited to, one or more double-diffused metal-oxide-semiconductor (DMOS) MOSFETs, one or more P-substrate (PMOS) MOSFETs, one or more trench (UMOS) MOSFETS, and one or more super-junction deep-trench MOSFETs (e.g., one or more CoolMOS™ MOSFETs).

In some examples, driver 4 may include sense driver 32 and the combination of sense driver 32, amplifier 34 and regulation driver 36 may form a regulation loop configured to generate a sense current proportional to the current generated by main driver 28. For instance, the regulation loop may generate sense current 38 that may be proportional to load current 30. In some examples, sense driver 32 may be a defined fraction of main driver 28 and the gate and source voltages of sense driver 32 and main driver 28 may be at similar levels. As illustrated in FIG. 1, the gate voltage of sense driver 32 and main driver 28 may be at the voltage level of control signal 26 and the source voltage of sense driver 32 and main driver 28 may be grounded. In some examples, sense driver 32 may include one or more transistors that are the same type as the transistors included in main driver 28. In some examples, sense driver 32 may include one or more transistors that are a different type than the transistors included in main driver 28.

In some examples, system 2 may include sense resistor 12, which may be configured to generate a voltage drop proportional to a current flowing through sense resistor 12. For instance, sense resistor 12 may be configured to generate a voltage drop proportional to sense current 38. As illustrated in FIG. 1, sense resistor 12 may be connected to current feedback connector 20 of driver 4.

In some examples, system 2 may include controller 8, which may be configured to control the amount of current provided to load 6. In some examples, controller 8 may be configured to determine an amount of current provided by driver 4 to load 6. For instance, controller 8 may be configured to determine an amount of current flowing through driver 4 based on a voltage drop across sense resistor 12. As one example, controller 8 may determine the amount of current flowing through driver 4 in accordance with equation (1) below, where $I_{D4}$ is the amount of current flowing through driver 4, K is the ratio of load current 30 to sense current 38, $V_{R12}$ is the voltage drop across sense resistor 12, an $R_{R12}$ is the resistance of sense resistor 12 (which may be known to controller 8).

$$I_{D4} = K\left(\frac{V_{R12}}{R_{R12}}\right) \quad (1)$$

In some examples, controller 8 may include an analog-to-digital converter (ADC) configured to generate one or more digital samples corresponding to a voltage drop, such as the voltage drop across sense resistor 12. In some examples, controller 8 may be configured to control the amount of current provided by driver 4 to load 6. For instance, controller 8 may output control signal 10 to driver 4 (e.g., to gate driver 24 via input connector 16) to control the amount of current provided by driver 4 to load 6. Examples of controller 8 may include, but are not limited to, one or more processors, including, one or more microprocessors, digital signal processors (DSPs), application specific integrated circuits (ASICs), field programmable gate arrays (FPGAs), or any other equivalent integrated or discrete logic circuitry, as well as any combinations of such components.

In operation, controller 8 may determine the amount of current flowing through driver 4 based on a voltage drop across sense resistor 12. For instance, gate driver 24 may output control signal 26 to the gates of both main driver 28 and sense driver 32. Responsive to receiving control signal 26, main driver 28 may cause load current 30 to flow through load 6. Amplifier 34 and regulation driver 36 may cause the drain voltage of sense driver 32 to follow the drain voltage of main driver 28. Additionally, the source voltages of sense driver 32 and main driver 28 may be tied together such that the current flowing through sense driver 32 (i.e., sense current 38) is proportional to the current flowing through main driver 28 (i.e., load current 30).

Sense current 38 may be passed through sense resistor 12 so as to generate a voltage drop across sense resistor 12 that is proportional to load current 30. Controller 8 may capture a digital sample of the voltage drop across sense resistor 12 and utilize the captured sample to determine a value of load current 30.

However, in some examples, it may be undesirable to convert sense current 38 into an analog voltage signal (i.e., the voltage drop across sense resistor 12) before converting the analog voltage signal into a digital sample. For instance, converting the current information into voltage information before it can be properly digitized may introduce additional problems and errors to the system. As one example, converting the current information into voltage information may require one or more external reference devices, such as sense resistor 12, and an external voltage reference. As another example, as illustrated by FIG. 1, converting the current information into voltage information may require that the analog signal cross the border from being a chip-internal signal, with respect to driver 4, to being an external analog signal which may be subject to increased interference and noise levels.

In some examples, the overall performance, such as the accuracy at which controller 8 may determine the value of load current 30, may strongly depend on the input voltage offset performance of amplifier 34 because it keeps the voltage potential of the main driver 28 and the sense driver 32 at the same level. If the voltage potential of main driver 28 and sense driver 32 are not at the same level, the result of equation (1) above may not be valid. However, for smaller load currents, such as 50 mA, the voltage drop across a main driver, such as a 100 milli-Ohm main driver, may become very small (e.g., 0.05 A*0.1 Ohm=5 mV). State of the art amplifiers without chopper compensation may end up with input voltage offsets in the range of +/−3 mV, which may be in the same range as a target regulation signal. By means of chopper techniques, the input voltage offset of amplifier 34 can be reduced to e.g. +/−100 μV. However, chopper techniques may require filtering in known state of the art implementations to become effective, which may limit the dynamic performance of such a system.

As such the overall performance of system 2 depends on the input voltage offset of amplifier 34, in some examples, amplifier 34 may comprise a high performance chopper amplifier e.g., to overcome this issue. While implementing chopper techniques may solve the offset issue, the implementation of chopper techniques may also require additional measures such as filtering or averaging which may negatively influence the dynamic performance of system 2. For instance, capacitor 14 may be included the filter sense current 38 as output by current feedback connector 20. Additionally, the implementation of chopper techniques may increase the utilization of the ADC included in controller 8, which may be a bottleneck with respect to the resources of controller 8. As such, it may be desirable to directly generate a digital representation of sense current 38 without first converting analog sense current 38 into an analog voltage value. Additionally, it may be desirable to directly generate the digital representation of sense current 38 using devices located within driver 4 such that an analog representation of sense current 38 may be a chip-internal signal.

Figure 2:
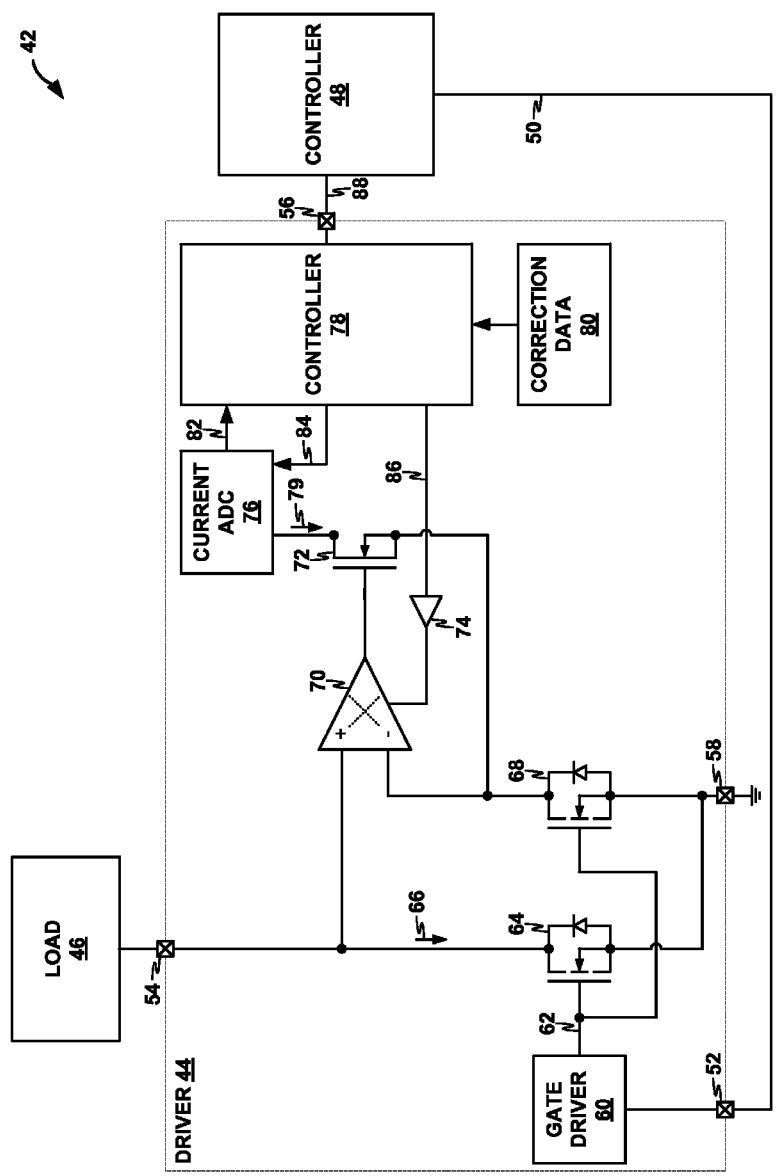
FIG. 2 is a block diagram of a system that includes another example device for monitoring an amount of current provided to a load, in accordance with one or more exemplary embodiments of this disclosure.

FIG. 2 is a conceptual diagram illustrating an example system 42 that includes an example device for monitoring an amount of current provided to a load, in accordance with one or more exemplary techniques of this disclosure. As illustrated in FIG. 2, system 42 includes driver 44, load 46, and controller 48.

In some examples, system 42 may include load 46, which may be configured to perform operations similar to load 6 of FIG. 1. For instance, load 46 may be configured to receive power from driver 44. In some examples, load 46 may include one or more light emitting devices (e.g., one or more light bulbs, one or more light emitting diodes (LEDs), one or more laser diodes, and the like), one or more batteries, one or more computing devices, one or more resistive devices, one or more capacitive devices, one or more inductive devices, any other device that uses electrical power, or any combination of the same. As illustrated in FIG. 2, load 46 may be connected to output connector 52 of driver 54 such that driver 54 may be a low-side driver with respect to load 46.

In some examples, system 42 may include controller 48, which may be configured to perform operations similar to controller 8 of FIG. 1. However, as opposed to controller 8 of FIG. 1 (which determines the amount of current flowing through the load based on a voltage drop across a sense resistor), controller 48 may determine the amount of current flowing through load 46 and/or main driver 64 by receiving a digital signal from driver 44 that indicates the amount of current flowing through load 46 and/or main driver 64. Examples of controller 48 may include, but are not limited to, one or more processors, including, one or more microprocessors, digital signal processors (DSPs), application specific integrated circuits (ASICs), field programmable gate arrays (FPGAs), or any other equivalent integrated or discrete logic circuitry, as well as any combinations of such components.

In some examples, system 42 may include driver 44, which may be configured to perform operations similar to driver 4 of FIG. 1. For instance, driver 44 may be configured to control the amount of current flowing through load 46 and output a signal that represents the amount of current flowing through load 46. However, as opposed to driver 4 of FIG. 1 which outputs an analog representation of the current flowing through load 46, driver 44 may output a digital representation of the current flowing through load 46. As illustrated in FIG. 2, driver 44 may include input connector 52, output connector 54, digital interface connector 56, ground connector 58, gate driver 60, main driver 64, sense driver 68, amplifier 70, regulation driver 72, buffer 74, current ADC 76, controller 78, and correction data 80.

In some examples, driver 44 may include input connector 52, output connector 54, digital interface connector 56, and ground connector 56. In some examples, one or more of input connector 52, output connector 54, digital interface connector 56, and ground connector 56 may be high voltage interface connectors, which, in some examples, may be larger than connectors that are not high voltage interface connectors. However, as opposed to current feedback connector 20 of FIG. 1, which is included for the sole purpose of outputting sense current 38, digital interface connector 56 may be included in driver 44 for one or more other purposes and not particularly to output the digital representation of the current. As such, by outputting the digital representation of the current via pre-existing pins, no additional high voltage resistant interfaces are required (though digital interface connector 56 may be high voltage resistant).

In some examples, driver 44 may include gate driver 60, which may be configured to perform operations similar to gate driver 24 of FIG. 1. For instance, gate driver 60 may be configured to output a signal to control one or more drivers. As illustrated in FIG. 2, gate driver 60 may output control signal 62 to the gates of main driver 64 and sense driver 68. In some examples, gate driver 60 may output control signal 62 based on a signal received from one or more other components of system 42, such as control signal 50 received from controller 48. In some examples, main driver 64 may include one or more power transistors, one or more metal-oxide-semiconductor field-effect transistors (MOSFETs), one or more thyristors, one or more insulated-gate bipolar transistors (IGBTs), and/or a combination of the same. Some example MOSFETs that may be included in main driver 64 include, but are not limited to, one or more double-diffused metal-oxide-semiconductor (DMOS) MOSFETs, one or more P-substrate (PMOS) MOSFETs, one or more trench (UMOS) MOSFETS, and one or more super junction deep-trench MOSFETs (e.g., one or more CoolMOS™ MOSFETs).

In some examples, driver 44 may include sense driver 68 that, in conjunction with amplifier 70 and regulation driver 72, forms a regulation loop configured to generate a sense current proportional to the current generated by main driver 64. For instance, the regulation loop may generate sense current 79 which may be proportional to load current 66. In some examples, sense driver 68 may be a defined fraction of main driver 64 and the gate and source voltages of sense driver 68 and main driver 64 may be at similar levels. As illustrated in FIG. 1, the gate voltage of sense driver 68 and main driver 64 may be at the voltage level of control signal 62 and the source voltage of sense driver 68 and main driver 64 may be grounded. In some examples, sense driver 68 may include one or more transistors that are the same type as the transistors included in main driver 64. In some examples, sense driver 68 may include one or more transistors that are a different type than the transistors included in main driver 64.

In some examples, driver 44 may include amplifier 70 that, as discussed above, may be a component in the regulation loop. In some examples, amplifier 70 may comprise a chopper amplifier configured to operate in a plurality of states. For instance, amplifier 70 may transition between the plurality of states based on chopper clock 86, which may be received from controller 78 via buffer 74.

In some examples, driver 44 may include current ADC 76 which may be configured to generate a digital representation of an analog current signal. For instance, ADC 76 may generate a digital representation of sense current 79. In some examples, ADC 76 may generate the digital representation of sense current in conjunction with controller 78. For instance, ADC 76 may receive control signal 84 from controller 78 that causes ADC 76 to output data 82 which may be used by controller 78 to generate the digital representation. Additional details of one example of ADC 76 are discussed below with reference to FIG. 3.

In some examples, driver 44 may include controller 78, which may be configured to generate the digital representation of sense current in conjunction with current ADC 76. For instance, controller 78 may output chopper clock 86 to cause amplifier 70 to transition between operational states, and ADC control signal 84 to current ADC 76 to cause current ADC 76 to output data 82 which may be used by controller 78 to generate the digital representation. In some examples, controller 78 may output chopper clock 86 and ADC control signal 84 such that current ADC 76 and amplifier 70 operate in synchronous.

In some examples, controller 78 may adjust the digital representation of the current flowing through load 6. As one example, controller 78 may compensate for offset errors and gain errors introduced either by the current to digital conversion process or by the regulation loop. As another example, controller 78 may reduce or eliminate errors caused by temperature effects. In some examples, controller 78 may utilize correction data 80 to adjust the digital representation. For instance, correction data 80 may include device-specific calibration data which may be used to compensate for e.g., a production spread of one or more components of driver 44, such as current ADC 76, with respect to offset, gain, and temperature behavior.

In any case, controller 78 may be configured to output the digital representation to one or more devices of system 42, such as controller 48. Controller 78 may output the digital representation using any suitable digital communication scheme, such as inter-integrated circuit (I2C), serial peripheral interface (SPI), or another communication scheme. Examples of controller 78 may include, but are not limited to, one or more processors, including, one or more microprocessors, digital signal processors (DSPs), application specific integrated circuits (ASICs), field programmable gate arrays (FPGAs), or any other equivalent integrated or discrete logic circuitry, as well as any combinations of such components.

Figure 3:
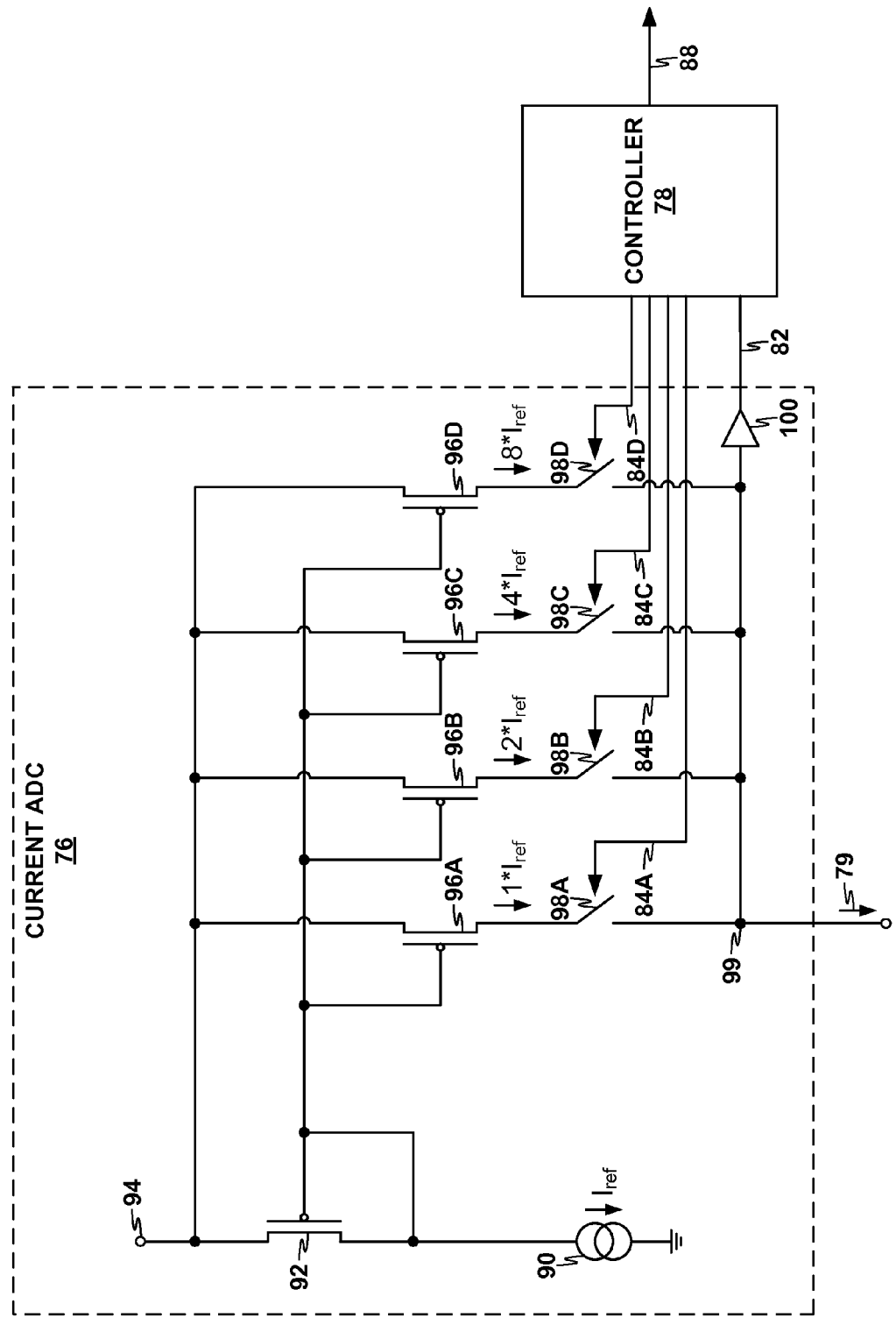
FIG. 3 is a conceptual diagram illustrating example details of a current ADC that may be included in a driver, such as driver 44 of FIG. 2, in accordance with one or more exemplary embodiments of this disclosure.

FIG. 3 is a conceptual diagram illustrating example details of a current ADC that may be included in a driver, such as driver 44 of FIG. 2, in accordance with one or more exemplary techniques of this disclosure. As illustrated in FIG. 3, current ADC 76 includes reference current source 90, transistor 92, voltage source 94, current sources 96A-96D (collectively, "binary weighted current sources 96"), switches 98A-98D (collectively, "switches 98"), and buffer 100.

Current ADC 76 may include reference current source 90 which may be configured to generate reference current (e.g., $I_{ref}$), and transistor 92 which, in tandem with reference current source 90 and voltage source 94, an may collectively bias binary weighted current sources 96 with reference current (e.g., $I_{ref}$).

Current ADC 76 may include binary weighted current sources 96 which may each be configured to generate a respective binary weighted current. For instance, binary weighted current source 96A may be configured to generate a current of $1*I_{ref}$, binary weighted current source 96B may be configured to generate a current of $2*I_{ref}$, binary weighted current source 96C may be configured to generate a current of $4*I_{ref}$, and binary weighted current source 96D may be configured to generate a current of $8*I_{ref}$. While illustrated in FIG. 3 as including four current sources, binary weighted current source 96 may include varying quantities of current sources depending on the desired resolution of the digital representation of the current value. For instance, by increasing the quantity of binary weight current sources 96, driver 44 may determine the digital representation of the current value at increased resolution, and vice versa.

Current ADC 76 may include switches 98 which may be configured to selectively couple respective binary weighted current sources to node 99. As illustrated in FIG. 3, switches 98 may selectively couple the respective binary weighted current sources to node 99 based on respective ADC control signals 84A-84D.

Current ADC 76 may include buffer 100 which may be configured to output signal 82 to indicate whether the amount of current collectively output by the binary weighted current sources of binary weighted current sources 96 coupled to node 99 is greater than sense current 79.

Referring now to both FIGS. 2 and 3 and in accordance with one or more techniques of this disclosure, driver 44 may output a digital representation of the amount of current flowing through load 46 and main transistor 64. In operation, gate driver 60 may output control signal 62 to the gates of both main driver 64 and sense driver 68. Responsive to receiving control signal 62, main driver 64 may cause load current 66 to flow through load 46. Amplifier 70 and regulation driver 72 may cause the drain voltage of sense driver 68 to follow the drain voltage of main driver 64. Additionally, the source voltages of sense driver 68 and main driver 64 may be tied together such that the current flowing through sense driver 68 (i.e., sense current 79) is proportional to the current flowing through main driver 64 (i.e., load current 66).

During a first time period, controller 78 may output control signal 86 such that amplifier 70 operates in a first state. While amplifier 70 operates in the first state, controller 78 and current ADC 76 may determine a first digital approximation of sense current 79. For instance, controller 78 may successively approximate the first digital representation of sense current 79 using binary search. As one example, where current ADC 76 includes four binary weighted current sources 96 such that the possible values of the first digital representation are between 0 and 15 (i.e., 16 possible codes), controller 78 may initially select a first code, and output ADC control signals 84 such that the total current output by binary weighted current sources 96 corresponds to the selected first code. For instance, where the selected code is 8, controller 78 may output ADC control signal 84D to cause switch 98D to couple binary weighted current source 96D to node 99, and control signals 84A-84C to cause switches 98A-98C to decouple binary weighted current sources 96A-96C from node 99.

While the total current output by binary weighted current sources 96 corresponds to the selected first code, buffer 100 may determine whether total current output by binary weighted current sources 96 is greater than sense current 79. For instance, if the total current output by binary weighted current sources 96 is greater than sense current 79, buffer 100 may output data 82 to controller 78 a logical high signal, and vice versa. If data 82 is a logical high signal, controller 78 may determine that sense current 79 is less than the first code, and vice versa.

Controller 78 may select a second code and output ADC control signals 84 such that the total current output by binary weighted current sources 96 corresponds to the second code. In some examples, controller 78 may select the second code based on the determination of whether sense current 79 was greater than or less than the current corresponding to the first code. As one example, if controller 78 determines that sense current 79 was less than the first code, controller 78 may select the second code as lesser than the first code. As another example, if controller 78 determines that sense current 79 was greater than the first code, controller 78 may select the second code as greater than the first code.

While the total current output by binary weighted current sources 96 corresponds to the selected second code, buffer 100 may determine whether the total current output by binary weighted current sources 96 is greater than sense current 79 and output corresponding data 82 to controller 78. If data 82 is a logical high signal, controller 78 may determine that sense current 79 is less than the second code, and vice versa.

Based on the comparisons, controller 78 may continue to refine the first digital approximation of sense current 79. As one example, if controller 78 determines that sense current 79 is greater than the first code and less than the second code, controller 78 may select a third code between the first code and the second code. As another example, if controller 78 determines that sense current 79 is greater than both the first code and the second code, controller 78 may select a third code greater than both the first code and the second code. As another example, if controller 78 determines that sense current 79 is less than both the first code and the second code, controller 78 may select a third code less than both the first code and the second code. In any case, controller 78 may output ADC control signals 84 such that the total current output by binary weighted current sources 96 corresponds to the third code.

While the total current output by binary weighted current sources 96 corresponds to the selected third code, buffer 100 may determine whether total current output by binary weighted current sources 96 is greater than sense current 79 and output corresponding data 82 to controller 78. If data 82 is a logical high signal, controller 78 may determine that sense current 79 is less than the third code, and vice versa.

In some examples, controller 78 may determine the first digital approximation of sense current 79 based on the results. For instance, if the third code is between the first code and the second code and controller 78 determines that sense current 79 is greater than the third code, controller 78 may determine that the first digital approximation of sense current 79 is between the third code and the second code.

In some examples, controller 78 may continue to repeat these steps (i.e., selecting a code, outputting corresponding ADC control signals 84, and determining whether the corresponding current is greater than or less than sense current 79) to e.g., refine the first digital approximation of sense current. For instance, if the third code is between the first code and the second code and controller 78 determines that sense current 79 is greater than the third code, controller 78 may select a fourth code between the third code and the second code. In this way, controller 78 may determine the first digital approximation of sense current 79 using successive approximation.

In some examples, the level of sense current 79 may depend on the operational state of amplifier 70. For instance, the level of sense current 79 may be higher when amplifier 70 operates in the first state, and lower when amplifier 70 operates in the second state. However, the difference between the level of sense current 79 when amplifier 70 operates in the first state and the level of sense current 79 when amplifier 70 operates in the second state may be limited. As such, the first digital approximation of sense current 79 determined when amplifier 70 operates in the first state may be similar to a second digital approximation of sense current 79 determined when amplifier 70 operates in a second state.

During a second time period, to determine the second digital approximation of sense current 79, controller 78 may output control signal 86 such that amplifier 70 operates in a second state. While amplifier 70 operates in the second state, controller 78 and current ADC 76 may determine the second digital approximation of sense current 79. For instance, based on data 82, controller 78 may select a fifth code and output ADC control signals 84 such that the total current output by binary weighted current sources 96 corresponds to the fifth code. In some examples, controller 78 may select the fifth code based on the first digital approximation of sense current 79. As one example, if the first digital approximation of sense current 79 corresponds to the fourth code, controller 78 may select the fifth code as identical to the fourth code. As another example, if the first digital approximation of sense current 79 corresponds to the fourth code, controller 78 may select the fifth code as the next code greater/lesser than the fourth code. In any case, controller 78 may output ADC control signals 84 such that the total current output by binary weighted current sources 96 corresponds to the fifth code.

While the total current output by binary weighted current sources 96 corresponds to the selected fifth code, buffer 100 may determine whether total current output by binary weighted current sources 96 is greater than sense current 79 and output corresponding data 82 to controller 78. If data 82 is a logical high signal, controller 78 may determine that the second digital approximation of sense current 79 is less than the fifth code, and vice versa.

As discussed above, the first digital approximation of sense current 79 determined when amplifier 70 operates in the first state may be similar to a second digital approximation of sense current 79 determined when amplifier 70 operates in the second state. As such, controller 78 may determine the second digital approximation of sense current 79 based on the first digital approximation of sense current 79 in a shorter amount of time than the amount of time used to determine the first digital approximation of sense current 79 (e.g., the length of the second time period may be less than the length of the first time period).

In any case, controller 78 may determine a final digital representation of sense current 79 based on the first digital approximation of sense current 79 and the second digital approximation of sense current 79. For instance, controller 78 may determine the final digital representation in accordance with equation (2) below, where $DI_{sense79}$ is the final digital representation of sense current 79, $DI_{sense79;A70=1}$ is the first digital approximation of sense current 79 (e.g., while amplifier 70 operates in the first state), and $DI_{sense79;A70=2}$ is the second digital approximation of sense current 79 (e.g., while amplifier 70 operates in the second state).

$$DI_{sense79} = \frac{DI_{sense79;A70=1} + DI_{sense79;A70=2}}{2} \qquad (2)$$

In some examples, controller 78 may be configured to calculate a result of equation (2) by performing a simple summation and shift operation (e.g., lowest significant bit (LSB) may either be discarded or used for increased resolution). As the final digital representation of sense current 79 is a digital value, controller 78 may easily perform one or more adjustments. For instance, controller 78 may adjust the final digital representation of sense current 79 to compensate for offset errors and gain errors introduced either by the current to digital conversion process or by the regulation loop. In this way, driver 44 may output a digital representation of load current 66 (e.g., a digital representation of sense current 79 which is proportional to load current 66) which does not need further processing.

In any case, controller 78 may output the final digital representation of sense current 79 to one or more external devices. For instance, controller 78 may output the final digital representation of sense current 79 to controller 48 as digital signal(s) 88 (e.g., using any suitable digital communication scheme, such as inter-integrated circuit (I2C), serial peripheral interface (SPI), and the like). In some examples, as opposed to outputting the final digital representation of sense current 79, controller 78 may adjust the final digital representation of sense current 79 to generate a final digital representation of load current 66 and output the final digital representation of load current 66 to the one or more external devices.

Figure 4:
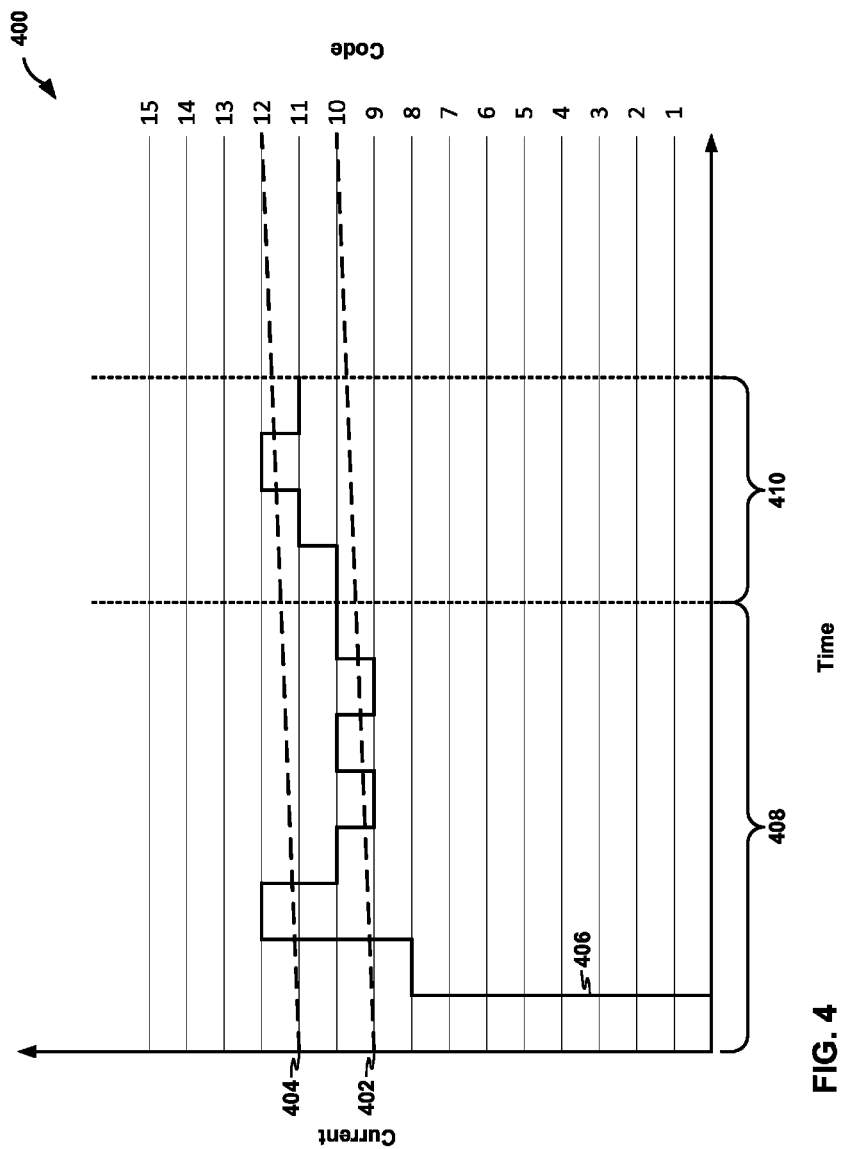
FIG. 4 is a graph illustrating exemplary signals of an example device that monitors the amount of current provided to a load, in accordance with one or more exemplary embodiments of this disclosure.

FIG. 4 is a graph illustrating exemplary signals of an example system that determines a digital representation of the amount of current provided to a load, in accordance with one or more techniques of this disclosure. As illustrated in FIG. 4, graph 400 may include a horizontal axis representing time, a left vertical axis representing current, a right vertical axis representing code values, plot 402 illustrating a first current signal, plot 404 illustrating a second current signal, and plot 406 illustrating a digital value. In some examples, the first current signal may represent a sense current generated while an amplifier operates in a first state, such as sense current 79 of FIG. 2 and FIG. 3 while amplifier 70 of FIG. 2 operates in the first state. In some examples, the second current signal may represent a sense current generated while an amplifier operates in a second state, such as sense current 79 of FIG. 2 and FIG. 3 while amplifier 70 of FIG. 2 operates in the second state. In some examples, the digital current value may represent a digital value generated by an ADC that directly converts an analog current into a digital value, such as current ADC 76 of FIG. 2 and FIG. 3.

In accordance with one or more techniques of this disclosure, controller 78 and ADC 76 may determine a digital representation of sense current 79. For instance, during first time period 408, controller 78 may output control signal 86 such that amplifier 70 operates in the first state. Controller 78 may select a first code to compare to sense current 79. As illustrated in FIG. 4, controller 78 may select code "8" and output ADC control signals 84 such that the total current output by binary weighted current sources 96 corresponds to code "8" (i.e., such that switch 98D is closed and switches 98A-98C are open). Controller 78 may determine that sense current 402 is greater than the current corresponding to code "8".

Controller 78 may select a second code that corresponds to a current greater than the first code. As illustrated in FIG. 4, controller 78 may select code "12" and output ADC control signals 84 such that the total current output by binary weighted current sources 96 corresponds to code "12" (i.e., such that switches 98C and 98D are closed and switches 98A and 98B are open). Controller 78 may determine that sense current 402 is less than the current corresponding to code "12".

Controller 78 may select a third code that corresponds to a current greater than the first code and less than the second code. As illustrated in FIG. 4, controller 78 may select code "10" and output ADC control signals 84 such that the total current output by binary weighted current sources 96 corresponds to code "10" (i.e., such that switches 98B and 98D are closed and switches 98A and 98C are open). Controller 78 may determine that sense current 402 is less than the current corresponding to code "10".

Controller 78 may select a fourth code that corresponds to a current greater than the first code and less than the third code. As illustrated in FIG. 4, controller 78 may select code "9" and output ADC control signals 84 such that the total current output by binary weighted current sources 96 corresponds to code "9" (i.e., such that switches 98A and 98D are closed and switches 98D and 98C are open). Controller 78 may determine that sense current 402 is less than the current corresponding to code "9". In this way, controller 78 may determine that a first digital approximation of sense current 79 (i.e., a digital approximation of sense current 402) is between code "9" and code "10".

In some examples, the value of sense current 402 may change over time. As such, controller 78 may continue to select codes to track the value of sense current 402. For instance, controller 78 may select a fifth code as a code adjacent to the fourth code. As illustrated in FIG. 4, controller 78 may select code "10" and output ADC control signals 84 such that the total current output by binary weighted current sources 96 corresponds to code "10" (i.e., such that switches 98B and 98D are closed and switches 98A and 98C are open). Controller 78 may determine that sense current 402 is still less than the current corresponding to code "10".

In some examples, after determining the digital approximation of sense current 402, controller 78 may toggle the operational state of amplifier 70 and determine a digital approximation of sense current 404 during second time period 410. In some examples, the value of sense current 404 may be similar to the value of sense current 402. As such, controller 78 may select a sixth code for use in determining the digital approximation of sense current 404 based on the determined digital approximation of sense current 402. As illustrated in FIG. 4, controller 78 may select code "10" and output ADC control signals 84 such that the total current output by binary weighted current sources 96 corresponds to code "10" (i.e., such that switches 98B and 98D are closed and switches 98A and 98C are open). Controller 78 may determine that sense current 404 is greater than the current corresponding to code "10".

Controller 78 may select a seventh code that corresponds to a current greater than the sixth code. As illustrated in FIG. 4, controller 78 may select code "10" and output ADC control signals 84 such that the total current output by binary weighted current sources 96 corresponds to code "11" (i.e., such that switches 98A, 98B, and 98D are closed and switch 98C is open). Controller 78 may determine that sense current 404 is greater than the current corresponding to code "11".

Controller 78 may select an eighth code that corresponds to a current greater than the seventh code. As illustrated in FIG. 4, controller 78 may select code "12" and output ADC control signals 84 such that the total current output by binary weighted current sources 96 corresponds to code "12" (i.e., such that switches 98C and 98D are closed and switches 98A and 98B are open). Controller 78 may determine that sense current 404 is less than the current corresponding to code "11". In this way, controller 78 may determine that a second digital approximation of sense current 79 (i.e., a digital approximation of sense current 404) is between code "11" and code "12".

In some examples, controller 78 may determine the final digital representation of sense current 79 based on the digital approximation of sense current 402 and the digital approximation of sense current 404. For instance, controller 78 may determine the final digital representation of sense current 79 in accordance with equation (2) above.

Figure 5:
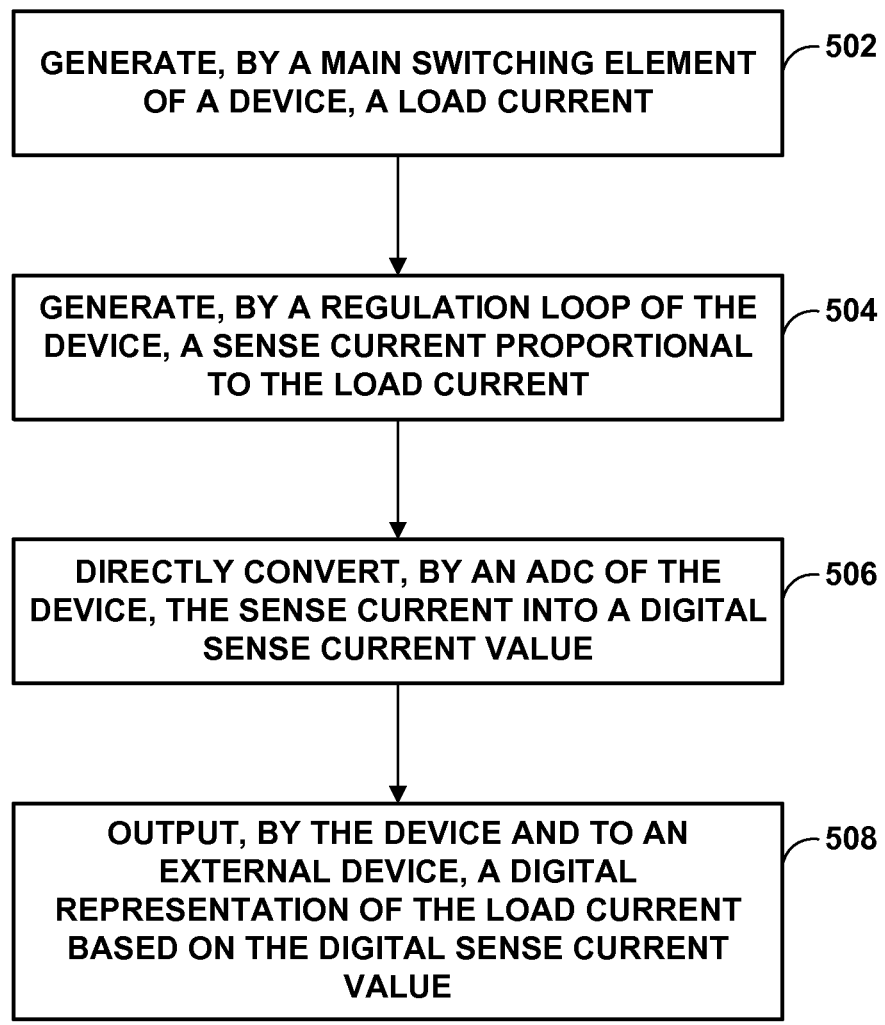
FIG. 5 is a flowchart illustrating exemplary operations of an example device that monitors the amount of current provided to a load, in accordance with one or more exemplary embodiments of this disclosure.

FIG. 5 is a flowchart illustrating exemplary operations of an example device that monitors an amount of current provided to a load, in accordance with one or more techniques of this disclosure. For purposes of illustration only, the example operations are described below within the context of driver 44 as shown in FIGS. 2-3.

In accordance with one or more techniques of this disclosure, a main switching element of a device may generate a load current (502). For instance, main driver 64 of driver 44 may generate load current 66 to provide power to load 46.

A regulation loop of the device may generate a sense current proportional to the load current (504). For instance, a regulation loop formed by sense driver 68, amplifier 70, and regulation driver 72 may generate sense current 79 which may be proportional to load current 66. As discussed above, in some examples, amplifier 70 may be a chopper amplifier configured to operate in a plurality of states.

An ADC of the device may directly convert the sense current into a digital sense current value (506). For instance, current ADC 76 and controller 78 may directly convert sense current 79 into a digital representation of sense current 79. As discussed above, in some examples, controller 78 may operate amplifier 70 and current ADC 76 in synchronous to, e.g., reduce any error added by amplifier 70 switching between operational states. In some examples, ADC 76 and controller 78 may directly convert sense current 79 into a digital representation of sense current 79 in accordance with the techniques of FIG. 4. For instance, during a first time period, controller 78 may cause amplifier 70 to operate in a first state while ADC 76 and controller 78 perform successive approximation to determine a range for sense current 79 and tracking to determine a first approximation of the digital sense current value that represents sense current 79. During a second time period, controller 78 may cause amplifier 70 to operate in a second state while ADC 76 and controller 78 perform tracking to determine a second approximation of the digital sense current value that represents sense current 79. In this way, driver 44 may directly determine a digital representation of the current flowing through load 46 without first converting the current flowing through load 46 into a voltage value.

In any case, the device may output a digital representation of the load current based on the digital sense current value to an external device (508). For instance, controller 78 may output the final digital representation of sense current 79 to controller 48 as digital signal(s) 88 (e.g., using any suitable digital communication scheme, such as inter-integrated circuit (I2C), serial peripheral interface (SPI), and the like). In this way, controller 48 may determine a digital representation of the current flowing through load 46 without additional components, such as sense resistor 12 and/or capacitor 14 of FIG. 1.

The following examples may illustrate one or more aspects of the disclosure:

Example 1

A method comprising: generating, by a main switching element of a device, a load current; generating, by a regulation loop of the device, a sense current proportional to the load current; directly converting, by an analog-to-digital converter (ADC) of the device, the sense current into a digital sense current value; and outputting, by the device and to an external device, a digital representation of the load current based on the digital sense current value.

Example 2

The method of example 1, further comprising: operating the regulation loop in synchronization with the ADC.

Example 3

The method of any combination of examples 1-2, wherein the regulation loop comprises a chopper amplifier configured to operate in a plurality of states, and wherein operating the regulation loop in synchronization with the ADC comprises: operating, during a time period, the chopper amplifier in a first state of the plurality of states; determining, by the ADC and during the time period, an approximation of the digital sense current value; and determining the digital sense current value based on the approximation of the digital sense current value.

Example 4

The method of any combination of examples 1-3, wherein the time period is a first time period, wherein the approximation of the digital sense current value is a first approximation of the digital sense current value, and wherein operating the regulation loop in synchronization with the ADC further comprises: operating, during a second time period, the chopper amplifier in a second state of the plurality of states; determining, by the ADC and during the second time period, a second approximation of the digital sense current value; and determining the digital sense current value based on the first approximation of the digital sense current value and the second approximation of the digital sense current value.

Example 5

The method of any combination of examples 1-4, wherein: determining, by the ADC and during the first time period, the first approximation of the digital sense current value comprises: performing, by the ADC and during a first portion of the first time period, a binary search to determine a range of the sense current; and determining, by the ADC and during a second portion of the first time period, the first approximation of the digital sense current value based on the range of the sense current, and determining, by the ADC and during the second time period, the second approximation of the digital sense current value comprises determining, by the ADC and during the second time period, the second approximation of the digital sense current value based on the range of the sense current.

Example 6

The method of any combination of examples 1-5, further comprising: determining the digital value based on the digital sense current value by at least adjusting digital sense current value to compensate for one or more errors.

Example 7

A power switching device comprising: a main switching element configured to generate a load current; a regulation loop configured to generate a sense current proportional to the load current; an analog-to-digital converter (ADC) configured to directly convert the sense current into a digital sense current value; and a controller configured to output a digital representation of the load current based on the digital sense current value to an external device.

Example 8

The power switching device of example 7, wherein the controller is configured to operate the regulation loop and the ADC in synchronization.

Example 9

The power switching device of any combination of examples 7-8, wherein the regulation loop comprises a chopper amplifier configured to operate in a plurality of states, and wherein the controller is configured to operate the regulation loop and the ADC in synchronization by at least: operating, during a time period, the chopper amplifier in a first state of the plurality of states; operating, during the time period, the ADC to determine, an approximation of the digital sense current value; and determining the digital sense current value based on the approximation of the digital sense current value.

Example 10

The power switching device of any combination of examples 7-9, wherein the time period is a first time period, wherein the approximation of the digital sense current value is a first approximation of the digital sense current value, and wherein the controller is further configured to operate the regulation loop and the ADC in synchronization by at least: operating, during a second time period, the chopper amplifier in a second state of the plurality of states; operating, during the second time period, the ADC to determine a second approximation of the digital sense current value; and determining the digital sense current value based on the first approximation of the digital sense current value and the second approximation of the digital sense current value.

Example 11

The power switching device of any combination of examples 7-10, wherein the controller is configured to: operate, during the first time period, the ADC to determine the first approximation of the digital sense current value by at least: operating, during a first portion of the first time period, the ADC to perform a binary search to determine a range of the sense current; and operating, during a second portion of the first time period, the ADC to determine the first approximation of the digital sense current value based on the range of the sense current, and operate, during the second time period, the ADC to determine the second approximation of the digital sense current value based on the range of the sense current.

Example 12

The power switching device of any combination of examples 7-11, wherein the controller is configured to determine the digital value based on the digital sense current value by at least adjusting digital sense current value to compensate for one or more errors.

Example 13

A power switching device comprising: means for generating a load current; means for generating a sense current proportional to the load current; means for directly converting the sense current into a digital sense current value; and means for outputting, to an external device, a digital representation of the load current based on the digital sense current value.

Example 14

The power switching device of example 13, further comprising: means for operating the means for generating the sense current in synchronization with the means for directly converting the sense current into a digital sense current value.

Example 15

The power switching device of any combination of examples 13-14, wherein the means for generating the sense current are configured to operate in a plurality of states, and wherein the means for operating the means for generating the sense current in synchronization with the means for directly converting the sense current into a digital sense current value comprise: means for operating, during a time period, means for generating the sense current in a first state of the plurality of states; means for determining, during the time period, an approximation of the digital sense current value; and means for determining the digital sense current value based on the approximation of the digital sense current value.

Example 16

The power switching device of any combination of examples 13-15, wherein the time period is a first time period, wherein the approximation of the digital sense current value is a first approximation of the digital sense current value, and wherein the means for operating the means for generating the sense current in synchronization with the means for directly converting the sense current into a digital sense current value comprise: means for operating, during a second time period, means for generating the sense current in a second state of the plurality of states; means for determining, during the second time period, a second approximation of the digital sense current value; and means for determining the digital sense current value based on the first approximation of the digital sense current value and the second approximation of the digital sense current value.

Example 17

The power switching device of any combination of examples 13-16, wherein: the means for determining, during the first time period, the first approximation of the digital sense current value comprise: means for performing, during a first portion of the first time period, a binary search to determine a range of the sense current; and means for determining, during a second portion of the first time period, the first approximation of the digital sense current value based on the range of the sense current, and the means for determining, during the second time period, the second approximation of the digital sense current value comprise means for determining, during the second time period, the second approximation of the digital sense current value based on the range of the sense current.

Example 18

The power switching device of any combination of examples 13-17, further comprising: means for determining the digital value based on the digital sense current value by at least adjusting digital sense current value to compensate for one or more errors.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various aspects have been described in this disclosure. These and other aspects are within the scope of the following claims.

The invention claimed is:

1. A method comprising:
   generating, by a main switching element of a device, a load current;
   generating, by a regulation loop of the device, a sense current proportional to the load current;
   directly converting, by an analog-to-digital converter (ADC) of the device, the sense current into a digital sense current value, wherein the regulation loop comprises a chopper amplifier and is operated in synchronization with the ADC; and
   outputting by the device, to an external device, a digital representation of the load current based on the digital sense current value.

2. The method of claim 1, wherein the chopper amplifier is configured to operate in a plurality of states, and wherein operating the regulation loop in synchronization with the ADC comprises:
   operating, during a time period, the chopper amplifier in a first state of the plurality of states;
   determining, by the ADC and during the time period, an approximation of the digital sense current value; and
   determining the digital sense current value based on the approximation of the digital sense current value.

3. The method of claim 2, wherein the time period is a first time period, wherein the approximation of the digital sense current value is a first approximation of the digital sense current value, and wherein operating the regulation loop in synchronization with the ADC further comprises:
   operating, during a second time period, the chopper amplifier in a second state of the plurality of states;
   determining, by the ADC and during the second time period, a second approximation of the digital sense current value; and
   determining the digital sense current value based on the first approximation of the digital sense current value and the second approximation of the digital sense current value.

4. The method of claim 3, wherein:
   determining, by the ADC and during the first time period, the first approximation of the digital sense current value comprises:
      performing, by the ADC and during a first portion of the first time period, a binary search to determine a range of the sense current; and
      determining, by the ADC and during a second portion of the first time period, the first approximation of the digital sense current value based on the range of the sense current, and
   determining, by the ADC and during the second time period, the second approximation of the digital sense current value comprises determining, by the ADC and during the second time period, the second approximation of the digital sense current value based on the range of the sense current.

5. The method of claim 1, further comprising:
determining the digital value based on the digital sense current value by at least adjusting digital sense current value to compensate for one or more errors.

6. A power switching device comprising:
a main switching element configured to generate a load current;
a regulation loop configured to generate a sense current proportional to the load current the regulation look comprising a chopper amplifier;
an analog-to-digital converter (ADC) configured to directly convert the sense current into a digital sense current value; and
a controller configured to output a digital representation of the load current based on the digital sense current value to an external device, the controller configured to operate the regulation loop and the ADC in synchronization.

7. The power switching device of claim 6, wherein the chopper amplifier is configured to operate in a plurality of states, and wherein the controller is configured to operate the regulation loop and the ADC in synchronization by at least:
operating, during a time period, the chopper amplifier in a first state of the plurality of states;
operating, during the time period, the ADC to determine, an approximation of the digital sense current value; and
determining the digital sense current value based on the approximation of the digital sense current value.

8. The power switching device of claim 7, wherein the time period is a first time period, wherein the approximation of the digital sense current value is a first approximation of the digital sense current value, and wherein the controller is further configured to operate the regulation loop and the ADC in synchronization by at least:
operating, during a second time period, the chopper amplifier in a second state of the plurality of states;
operating, during the second time period, the ADC to determine a second approximation of the digital sense current value; and
determining the digital sense current value based on the first approximation of the digital sense current value and the second approximation of the digital sense current value.

9. The power switching device of claim 8, wherein the controller is configured to:
operate, during the first time period, the ADC to determine the first approximation of the digital sense current value by at least:
operating, during a first portion of the first time period, the ADC to perform a binary search to determine a range of the sense current; and
operating, during a second portion of the first time period, the ADC to determine the first approximation of the digital sense current value based on the range of the sense current, and
operate, during the second time period, the ADC to determine the second approximation of the digital sense current value based on the range of the sense current.

10. The power switching device of claim 6, wherein the controller is configured to determine the digital value based on the digital sense current value by at least adjusting digital sense current value to compensate for one or more errors.

11. A power switching device comprising:
means for generating a load current;
means for generating a sense current proportional to the load current;
means for directly converting the sense current into a digital sense current value;
means for operating the means for generating the sense current in synchronization with the means for directly converting the sense current into a digital sense current value; and
means for outputting, to an external device, a digital representation of the load current based on the digital sense current value.

12. The power switching device of claim 11, wherein the means for generating the sense current are configured to operate in a plurality of states, and wherein the means for operating the means for generating the sense current in synchronization with the means for directly converting the sense current into a digital sense current value comprise:
means for operating, during a time period, means for generating the sense current in a first state of the plurality of states;
means for determining, during the time period, an approximation of the digital sense current value; and
means for determining the digital sense current value based on the approximation of the digital sense current value.

13. The power switching device of claim 12, wherein the time period is a first time period, wherein the approximation of the digital sense current value is a first approximation of the digital sense current value, and wherein the means for operating the means for generating the sense current in synchronization with the means for directly converting the sense current into a digital sense current value comprise:
means for operating, during a second time period, means for generating the sense current in a second state of the plurality of states;
means for determining, during the second time period, a second approximation of the digital sense current value; and
means for determining the digital sense current value based on the first approximation of the digital sense current value and the second approximation of the digital sense current value.

14. The power switching device of claim 13, wherein:
the means for determining, during the first time period, the first approximation of the digital sense current value comprise:
means for performing, during a first portion of the first time period, a binary search to determine a range of the sense current; and
means for determining, during a second portion of the first time period, the first approximation of the digital sense current value based on the range of the sense current, and
the means for determining, during the second time period, the second approximation of the digital sense current value comprise means for determining, during the second time period, the second approximation of the digital sense current value based on the range of the sense current.

15. The power switching device of claim 11, further comprising:
means for determining the digital value based on the digital sense current value by at least adjusting digital sense current value to compensate for one or more errors.

* * * * *